United States Patent
Zhang et al.

(10) Patent No.: US 9,666,671 B2
(45) Date of Patent: May 30, 2017

(54) SEMICONDUCTOR DEVICE WITH COMPOSITE DRIFT REGION AND RELATED FABRICATION METHOD

(71) Applicants: Zhihong Zhang, Chandler, AZ (US); Hongning Yang, Chandler, AZ (US); Jiang-Kai Zuo, Chandler, AZ (US)

(72) Inventors: Zhihong Zhang, Chandler, AZ (US); Hongning Yang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/279,991

(22) Filed: May 16, 2014

(65) Prior Publication Data

US 2015/0333177 A1   Nov. 19, 2015

(51) Int. Cl.
| | |
|---|---|
| *H01L 29/10* | (2006.01) |
| *H01L 29/78* | (2006.01) |
| *H01L 29/66* | (2006.01) |
| *H01L 29/36* | (2006.01) |
| *H01L 29/06* | (2006.01) |
| *H01L 29/08* | (2006.01) |
| *H01L 21/265* | (2006.01) |

(52) U.S. Cl.
CPC ...... *H01L 29/1045* (2013.01); *H01L 29/0653* (2013.01); *H01L 29/0847* (2013.01); *H01L 29/36* (2013.01); *H01L 29/66659* (2013.01); *H01L 29/66681* (2013.01); *H01L 29/7816* (2013.01); *H01L 29/7835* (2013.01); *H01L 21/2652* (2013.01); *H01L 21/26513* (2013.01)

(58) Field of Classification Search
None
See application file for complete search history.

(56) References Cited

U.S. PATENT DOCUMENTS

| | | | |
|---|---|---|---|
| 7,268,045 B2 | 9/2007 | Hower et al. | |
| 2007/0080398 A1* | 4/2007 | Lee | H01L 29/0878 257/340 |
| 2010/0006935 A1* | 1/2010 | Huang | H01L 29/7835 257/341 |
| 2013/0234246 A1 | 9/2013 | Yang et al. | |
| 2013/0256794 A1* | 10/2013 | Lee | H01L 29/7816 257/339 |
| 2013/0292764 A1 | 11/2013 | Yang et al. | |

* cited by examiner

*Primary Examiner* — Matthew Reames
*Assistant Examiner* — Steven B Gauthier (57) ABSTRACT

A device includes a semiconductor substrate, a body region in the semiconductor substrate having a first conductivity type and in which a channel is formed during operation, source and drain regions in the semiconductor substrate and having a second conductivity type, the source region being disposed on the body region, and a composite drift region in the semiconductor substrate, having the second conductivity type, and through which charge carriers from the source region drift to reach the drain region after passing through the channel. The composite drift region includes a first section adjacent the channel, a second section adjacent the drain region, and a third section disposed between the first and second sections. The first and second sections have a lower effective dopant concentration level than the third section.

18 Claims, 3 Drawing Sheets

FIG. 3

SEMICONDUCTOR DEVICE WITH COMPOSITE DRIFT REGION AND RELATED FABRICATION METHOD

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes, as well as a body electrode. A control voltage applied to the gate electrode controls the flow of current through a controllable conductive channel between the source and drain electrodes.

High voltage power and analog transistor devices are designed to be tolerant of the high currents and voltages that are present in power applications, such as motion control, air bag deployment, and automotive fuel injector drivers, and analog applications, such as current mirrors and amplifiers. One type of such power transistors is a laterally diffused metal-oxide-semiconductor (LDMOS) transistor. In an LDMOS device, a drift space is provided between the channel region and the drain region.

Power devices are susceptible to the generation of secondary charge carriers through impact ionization. LDMOS devices are often used in applications, such as automotive applications, involving operational voltages greater than 45 Volts. In an n-channel LDMOS transistor device, such high voltages may lead to areas with high electric fields, such as near the drain boundary. Accelerated by the high electric fields, electrons in the conduction band may be energized to an extent that electron-hole pairs are created from collisions with electrons in the valance band. The secondary charge carriers, i.e., holes in an n-channel device, are then attracted to a body terminal of the device, thereby contributing to the body current of the device. The high body current may lead to lower output impedance, which is undesirable for analog applications.

LDMOS transistor devices may be damaged as a result of the flow of secondary charge carriers across the device body. As the body current increases, the interior potential of the body also increases. If the interior potential is raised to an extent that the junction with the source is forward biased, a parasitic npn bipolar transistor formed via the source (emitter), body (base), and drain (collector) regions of the LDMOS transistor device is activated. Very large, damaging currents can result via the activation of the parasitic bipolar transistor, an operating condition referred to as "snapback."

LDMOS devices are often characterized by a "safe operating area" in which the operating current and voltage levels are below levels that would result in a snapback event. Attempts to remain within the safe operating area to avoid device destruction or other damage are often undesirably limiting factors for device operation and application.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

LDMOS and other transistor devices and electronic apparatus are configured with a composite drift region. The composite drift region includes three or more sections. In some embodiments, the composite drift region includes a channel-side section, a drain-side section, and an interior section disposed between the channel-side section and the drain-side section. The interior section has a higher dopant concentration level than the other sections. The channel-side and drain-side sections may be parts of an exterior section having a hole in which the interior section is disposed. The composite drift region may include a further interior section adjacent the drain-side section and having a higher dopant concentration level than the other sections.

The sections of the composite drift region may be arranged and otherwise configured to improve the output impedance and the safe operating area (SOA) of the disclosed devices. The breakdown voltage level (BVDSS) of the disclosed devices may also be increased as a result of the lower dopant concentration level of the channel-side and drain-side sections. The lower dopant concentration level may spread the electric field within the disclosed devices more evenly, thereby reducing the peak electric field reached within the device during operation. The lower peak may then reduce impact ionization within the device, which, in turn, reduces the body current, thereby improving the output impedance. The lower body current reduces the interior voltage drop across the body of the devices, thereby improving the SOA. The lower peak also improves the breakdown voltage level. The improvements in the output impedance, the SOA, and breakdown voltage level may thus be achieved without increasing the device area.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. For example, the composite field drift regions of the disclosed devices may be useful in a wide variety of power electronic devices. The composite field drift regions are also not limited to any one particular type of reduced surface field (RESURF) configuration. The disclosed devices may have varying RESURF structures, including single, double, or other RESURF structural arrangements, each of which may be referred to herein as a RESURF transistor structure.

For convenience of description and without any intended limitation, n-channel LDMOS devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
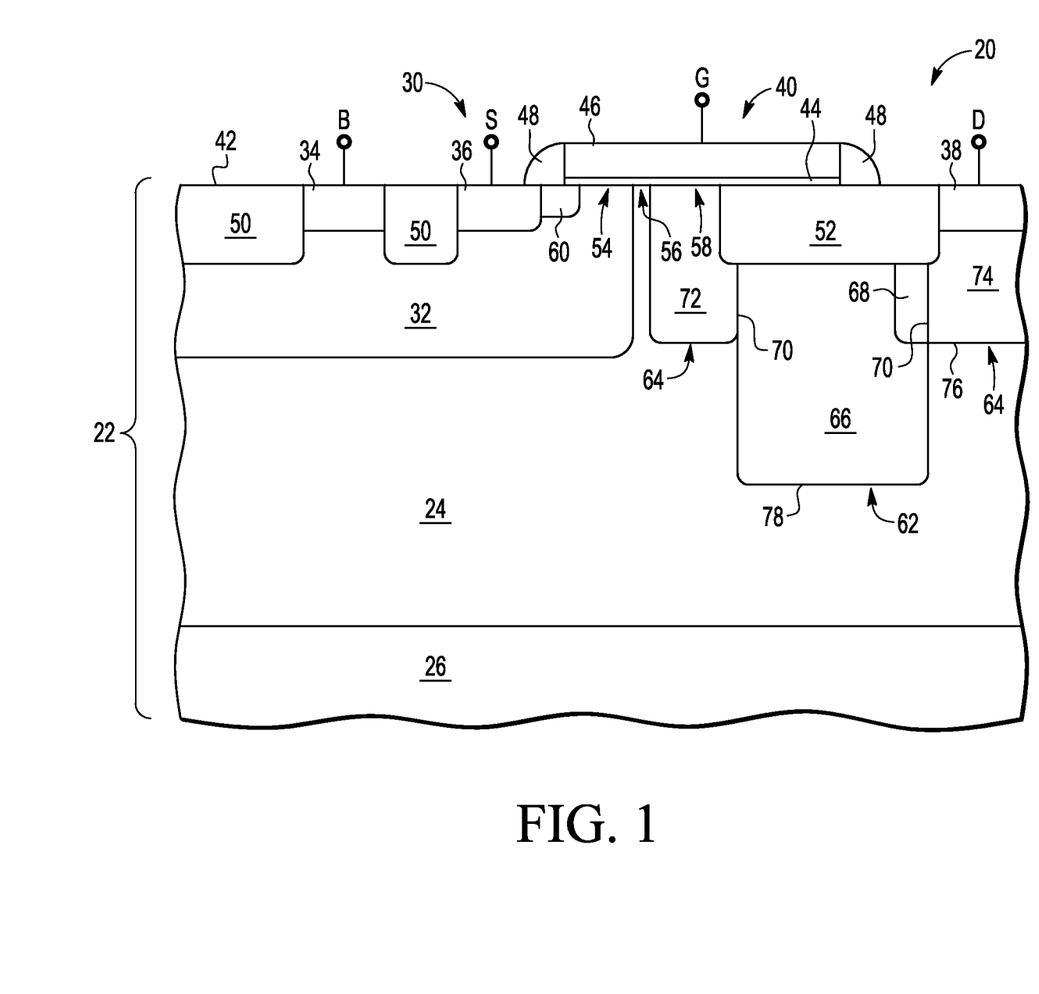
FIG. 1 is a cross-sectional, schematic view of an n-channel LDMOS transistor device with a composite drift region in accordance with one embodiment.

FIG. 1 is a schematic cross-sectional view of an example of an n-channel field LDMOS device 20 constructed in accordance with one embodiment. The device 20 is configured as a RESURF transistor as described below. The device 20 includes a semiconductor substrate 22, which may, in turn, include a number of epitaxial layers 24. In this example, the semiconductor substrate 22 includes a single p-type epitaxial layer 24 grown on an original substrate 26 (e.g., a moderately or heavily doped p-type substrate). The device 20 may alternatively or additionally include non-epitaxial layers in which one or more device regions are formed. Any one or more of the layers of the semiconductor substrate 22 may include silicon. Alternative or additional semiconductor materials may be used in other embodiments. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area or region 30 of the device 20 is depicted in FIG. 1. The device region 30 includes a number of active areas of the device 20. In some cases, only one side, half, or other portion of the device region 30 is shown. For example, the device region 30 may be laterally symmetrical and, thus, include a portion that mirrors the portion shown. In other embodiments, the single gate portion of the device region 30 shown in FIG. 1 may be replicated any number of times (e.g., 10, 20, or more times).

One or more device isolation regions may define the device region 30. Such isolation regions may surround the device region 30. For example, one or more doped n-type isolation wells or sinks (not shown) and/or deep trench isolation (DTI) regions may define the periphery of the device region 30 and isolate the device 20 from adjacent devices. The semiconductor substrate 22 may additionally include one or more buried layers (not shown), such as an n-type buried layer (NBL). For example, the buried layer may be formed in the semiconductor substrate 22 before the growth of the epitaxial layer 24 thereof. Such buried layers may extend across (e.g., under) the device region 30 of the device 20 to act as a barrier or isolation layer separating the device region 30 from the rest of the substrate (e.g., the original substrate 26). Any number of the isolation wells, sinks, or buried layers may be connected to one another. Additional, fewer, or alternative device isolation layers or regions may be provided in the semiconductor substrate 22.

The device 20 includes a device body or body region 32 in the semiconductor substrate 22. The body region 32 may include a p-type well formed in the epitaxial layer 24 of the substrate 22. The body region 32 may be biased via a heavily doped p-type body contact region 34 formed in or otherwise above the p-type well of the body region 32 in the semiconductor substrate 22. The dopant concentration of the contact region 34 may be at a level sufficient to establish an ohmic contact to the body region 32.

The device 20 includes heavily doped source and drain regions 36 and 38 in the semiconductor substrate 22. The source and drain regions 36 and 38 are laterally spaced from one another in the lateral dimension shown in the cross-section of FIG. 1. In this example, the source and drain regions 36 and 38 are n-type doped portions of the epitaxial layer 24. The heavily doped source region 36 is disposed within the body region 32. The heavily n-type doped drain region 38 is spaced from the body region 32. The regions 36, 38 may have a dopant concentration at a level sufficient to establish ohmic contacts to bias the source region 36 and the drain region 38. In a typical LDMOS configuration, the drain region 38 is biased at a high voltage, Vds, relative to the source region 36, which may, for example, be considered to be at ground potential. Any number of source or drain regions 36, 38 may be provided. In some embodiments, the drain region 38 is centered or otherwise disposed between, or laterally surrounded by, the source region 36.

The device 20 includes a gate structure 40 formed on or above a surface 42 of the semiconductor substrate 22. The gate structure 40 is disposed between the source region 36 and the drain region 38. In some embodiments, the gate structure 40 surrounds the drain region 38, which may be centrally or internally disposed within the device area 30. Alternatively, the gate structure 40 may be arranged in a dual gate finger configuration in which two transistors are symmetrically arranged to share the same drain region 38. Other multiple gate finger embodiments having any number of gate fingers are possible, including embodiments in which body contacts are shared by adjacent fingers.

The gate structure 40 includes a gate dielectric layer 44. In some examples, the gate dielectric layer 44 includes silicon dioxide (or oxide) deposited or otherwise formed on the surface 42. The gate structure 40 includes a conductive layer 46 (e.g., a polysilicon plate) on or above the gate dielectric layer 44, which insulates the conductive layer 46 from the substrate 22. The gate structure 40 may include one or more dielectric sidewall spacers 48 disposed along lateral edges of the layers 44, 46. The sidewall spacers 48 may cover the lateral edges to act as a silicide blocker to prevent a silicide short along the surface 42. The sidewall spacers 48 may provide spacing to separate the conductive components of the gate structure 40 from the source region 36 and other regions of the active region 30. In this example, one of the sidewall spacers 48, located on the source side of the gate structure 40, is used for alignment purposes in defining an edge of the source region 36.

The configuration of the gate structure 40 may vary. For example, the configuration of the gate structure 40 may include multiple conductive layers (e.g., polysilicon plates). Other characteristics, such as the components, materials, and shape, of the gate structure 40 may vary from the example shown.

One or more shallow trench isolation (STI) regions 50, 52 may be formed at the surface 42 in the semiconductor substrate 22. In this embodiment, the STI region 52 spaces the gate structure 40 from the conductive regions in the semiconductor substrate 22 in the active region 30 of the device 20. The STI region 52 may isolate the gate structure 40 from the high voltage applied to the drain region 38. Hot carrier injection into the oxide layer of the gate structure 40 may thus be avoided or minimized. The STI region 52 may also protect other regions or components of the device 20 from the high voltage applied to the drain region 38.

When the gate structure 40 is biased, charge carriers (in this case, electrons; alternatively, holes) accumulate in a channel area or region 54 of the body region 32 under the gate structure 40. In this example, the accumulation of electrons results in a charge inversion in the channel region 54 from the p-type body region 32 to an n-type conduction layer or area near the surface 42 of the semiconductor substrate 22. Once a sufficient amount of the charge carriers accumulate in the conduction layer or area, current can flow from the source region 36 toward the drain region 38 through the channel region 54.

The channel region 54 may include other regions or areas in the semiconductor substrate 22 in which charge inversion occurs as a result of the bias applied to the gate structure 40. Charge carriers may also accumulate at the surface 42 of the substrate 22 outside of or beyond the body region 32. In this example, charge carriers may accumulate in an area 56 of the epitaxial layer 24 adjacent the body region 32 near the surface 42. The area 56 may be considered to be part of the channel region 54 of the device 20. The channel region 54 and the area 56 form part of a conduction path of the device 20. In other cases, the conduction path does not include the area 56 or other portion of the epitaxial layer 24.

The conduction path need not be limited to regions in which charge inversion occurs. In the LDMOS embodiment of FIG. 1, the conduction path also includes an accumulation region 58 of the device 20. The accumulation region 58 has the opposite conductivity type of the body region 32. In this example, the accumulation region 58 may include an n-type region, such as a portion of an n-type field drift region (or layer or area thereof) described below. During operation, charge carriers accumulate in the accumulation region 58 upon application of the gate bias voltage.

The conduction path of the device 20 may include other regions, whether n-type or p-type, at or near the surface 42 in which conduction is enabled or enhanced via the bias voltage applied to the gate structure 40. For example, the conduction path may include one or more intermediately or moderately doped n-type transition regions 60 (or source/drain extension regions) in the semiconductor substrate 22 at or near the surface 42. The transition regions 60 may be configured as a lightly doped drain (LDD) region adjacent the heavily doped portion of the source region 36 or the drain region 38. In this example, one transition region 60 extends from the source region 36 under the gate structure 40 as shown. The n-type transition region 60 may be a diffused region formed in connection with the source region 36. The transition region 60 is positioned to electrically connect the source region 36 with the channel during operation. Alternatively or additionally, the transition region(s) 60 may be positioned and/or otherwise configured to protect the gate structure 40. Another transition region may extend from the drain region 38 toward the gate structure 40. The n-type transition region(s) 60 may assist in controlling the electric field at or near the surface 42, including in areas other than those areas near the source region 36 or the drain region 38. The n-type transition region 60 may help prevent hot carrier injection into the oxide or other component of the gate structure 40.

The device 20 includes a composite drift region 62 in the semiconductor substrate 22. The composite drift region 62 is disposed adjacent the body region 32 to space the drain region 38 from the channel region 54 and the body region 32. In this example, the composite drift region 62 is an n-type region disposed in the epitaxial layer 24. During operation, charge carriers from the source region 36 (e.g., electrons) drift through the composite drift region 62 after passing through the channel region 54. The charge carriers drift under the electric field arising from the voltage applied between the drain region 38 and the source region 36. One or more portions of the composite drift region 62 may be configured for depletion during operation to reduce the peak magnitude of the electric field in accordance with the reduced surface field (RESURF) effect. The reduction in the peak electric field may lead to an improved (e.g., higher) breakdown voltage level.

The composite drift region 62 may include a number of constituent regions, each being referenced herein as sections or portions. In this example, the composite drift region 62 includes an exterior or outer section 64, an interior or inner section 66, and an interior or inner section 68. The exterior section 64 includes a hole 70 in which the interior sections 66, 68 are disposed. The exterior section 64 may be ring-shaped. Alternatively, the exterior section 64 includes multiple portions spaced apart from one another, such as portions on either side of the hole 70.

The exterior section 64 and the interior sections 66, 68 are formed by a number of dopant implantation procedures. The dopant implantation procedures are configured to establish different dopant concentration levels for the sections 64, 66, 68. Examples of the procedures and concentration levels are provided below. The dopant implantation procedures may be overlapping or non-overlapping. In the embodiment of FIG. 1, the exterior section 64 is formed by a first dopant implantation procedure. The interior section 66 is formed by a second dopant implantation procedure. The interior section 68 is formed where the first and second dopant implantation procedures overlap. Additional, fewer, or alternative sections may be provided. For example, the composite drift region 62 may include a single exterior section and a single interior section formed by two, non-overlapping dopant implantation procedures. The dopant implantation procedures may not be configured line-on-line, in which case one or more further (or other) interior sections may be formed.

In the embodiment of FIG. 1, the exterior section 64 includes an end portion 72 adjacent the channel region 54 (the channel-side section or portion) and an end portion 74 adjacent the drain region 38 (the drain-side section or portion). The interior sections 66, 68 are disposed between the end portions 72, 74. The interior section 66 is contiguous with the end portion 72. The interior section 68 is contiguous with the end portion 74. The interior section 68 is disposed between the interior section 66 and the end portion 74. Taken together, the end portions 72, 74 may surround the interior sections 66, 68. Alternatively, the exterior section 64 may include one or more further sections or portions outside of the cross section shown in FIG. 1. For example, the end portions 72, 74 may be connected by further portions or sections of the exterior section 64 to complete the ring shape that surrounds the interior sections 66, 68.

The exterior and interior sections 64, 66, 68 include or are configured as respective wells or well regions, such as a portion of a well. The interior section 66 may be defined by, and include, a deep well region. In the embodiment of FIG. 1, the deep well region corresponds with a portion of a deep well not overlapping with a shallow well used to define the exterior section 64. The shallow well has a lower boundary 76. The lower boundary 76 establishes the depth of the exterior section 64 and the end portions 72, 74 thereof. The deep well has a lower boundary 78. The lower boundary 76 is shallower than the lower boundary 78. The difference in the lower boundaries 76, 78 may vary based on the dopant implantation procedures used to form the respective sections.

The exterior section 64 has a lower effective dopant concentration level than the interior section 66. The interior section 68 has a higher effective dopant concentration level than the exterior section 64 and the interior section 66. The higher dopant concentration level may be achieved through overlapping implantation procedures. Each end portion 72, 74 of the exterior section 64 may share or have a common dopant concentration profile. Each end portion 72, 74 may be formed by the same implantation procedure, which leads to the common dopant concentration profile. In the embodiment of FIG. 1, the dopant concentration profiles of the end portions 72, 74 are the same from a first depth at which the end section 74 connects with the drain region 38 to a second depth that corresponds with the lower boundary 76. The effective dopant concentration level of a section or region may correspond with the dopant concentration level determinative of device operation or operational parameters. The effective dopant concentration levels of the sections of the composite drift region 62 may be established at depths or other locations through which the charge carriers drift during operation. Exemplary values and/or value ranges of the dopant concentration levels are set forth below.

One or more of the sections or portions of the composite drift region 62 are disposed under the isolation region 52. In the embodiment of FIG. 1, both of the interior sections 66, 68 are disposed under the isolation region 52. Neither interior section 66 nor the interior section 68 extends laterally beyond the isolation region 52. The implantation procedure used to form the deep well may be configured to implant the dopant ions through the isolation region 52 to dope the semiconductor substrate 22. Implanting the dopant ions through the isolation region 52 may be useful to limit or control the depth of the implantation. For example, a pre-existing dopant implantation procedure configured for use in forming other transistor devices may be used without concern that the well reaches a depth that adversely affects device performance. Device performance may be affected if, for instance, the well is too close to an insulator layer of an SOI substrate or other buried isolation layer.

The lateral dimensions, position, and shape of the hole 70 may vary. For instance, the hole 70 may have various widths (i.e., the lateral dimension shown in FIG. 1) and/or lengths (i.e., the lateral dimension orthogonal to the lateral dimension shown in FIG. 1). For example, the hole 70 may extend beyond the isolation region 52. The size of the hole 70 in the lateral dimension (i.e., the length dimension) not shown in FIG. 1 may vary. In some cases, the hole 70 extends across the entire length of the device region 30. Alternatively, the hole 70 does not extend across the entire length, but is instead surrounded, and defined along all of its sides, by the exterior section 64.

The end portion (or section) 72 of the composite drift region 62 may be disposed at the surface 42 under the gate structure 40. The section 72 may be adjacent to, define, or form a part of, the accumulation region 58 of the device 20. In contrast, the other sections 66, 68, and 74 of the composite drift region 62 may be spaced from the surface 42. For example, the interior sections 66, 68 may be spaced from the surface 42 by the STI region 52. The section 74 may be configured as a well in or on which the drain region 38 formed or defined. Additional or alternative regions may be formed in connection with the drain region 38. For example, one or more transition extension regions (e.g., an n-type lightly doped drain region, or NLDD region) may be formed in, on, or otherwise adjacent to the end portion 74 in connection with the drain region 38.

One or more of the above-described sections of the composite drift region 62 may be depleted, at least in part, during operation. The sections are depleted along reverse-biased junctions with, for instance, the epitaxial layer 24 and/or the body region 32. The junctions are reverse biased as a result of the application of a drain voltage Vds between the source region 36 and the drain region 38. The reverse-biased junctions may reduce the electric field, as in the RESURF effect, for improved breakdown performance. In an alternative embodiment, the device 20 may be configured to establish a double RESURF effect, in which, for example, one or more additional regions may be disposed adjacent one or more sections of the composite drift region 62 for further depletion along the conduction path between the body region 32 and the drain region 38. Further details regarding the structural and operational characteristics of suitable RESURF regions are set forth in U.S. Pat. No. 6,882,023 ("Floating RESURF LSMOSFET and Method of Manufacturing Same").

The configuration of the composite drift region 62 may reduce impact ionization during operation. Lowering impact ionization, in turn, decreases the body current. The composite drift region 62 lowers impact ionization through the arrangement of multiple sections (or constituent regions) of different dopant concentration levels. The multiple sections may thus provide an adaptive drift region. For example, the lower doping level of the exterior region 64 and other aspects of the adaptive drift region may be provided or configured to lower impact ionization, decrease body current, and accordingly improve (e.g., increase) the output impedance (Rout) of the device 20 in the saturation regime of device operation. For example, the output impedance may increase by about the same factor that the impact ionization decreases. The increased output impedance leads to a flatter Id-Vd curve in the saturation regime of operation.

The composite drift region 62 may provide further benefits beyond the improved output impedance. The lower dopant concentration level of the exterior section 64 may, in turn, establish a higher breakdown voltage level for the device 20. The improvement in output impedance may also lead to an improvement in SOA.

The reduction in impact ionization may be achieved without relying upon a dopant implantation procedure dedicated to forming a lightly doped drift well. The composite drift region 62 may avoid the cost of adding a dedicated implantation procedure through the use of multiple existing (e.g., available) implantation procedures. In the embodiment of FIG. 1, two existing implantation procedures are used to form each of the sections of the composite drift region 62. An existing shallow well implant is used to form the exterior section 64 (including the portions 72, 74). The shallow well implant is configured with the hole 70. An existing deep well implant is then performed through the hole 70 to form the interior section 66 and connect the portions 72, 74. The existing shallow well and deep well implants overlap to form the interior section 68. The overlap of the implants may be used to maximize the dopant concentration level of the composite drift region 62 near the drain region 38 given the two implants.

The existing implantation procedures may be optimized for the formation of regions of other transistor devices, such as bipolar transistor and other power devices. Further details regarding the existing procedures are provided in connection with the graphical plots shown in FIG. 2 and the embodiments described in connection with FIG. 3.

The shape, depth, dopant concentration level, and other characteristics of the sections of the composite drift region 62 may vary. For example, the lateral position at which the sections 66, 72 meet may vary from the example shown. For instance, the sections 66, 72 may not meet at a lateral position under the gate structure 40. The extent to which the gate structure 40 overlaps the section 66 may thus vary. The lateral positioning of the STI region 52 may also vary. The interior section 68 may extend to a greater or lesser extent under the STI region 52. The exterior section 74 may be shifted relative to the STI region 52 as well. For example, the extent to which the exterior section 74 extends laterally under the STI region 52 may be increased or decreased. The sections 66, 68 may thus extend beyond the STI region 52 in some cases.

The lateral spacing of the composite drift region 62 and the body region 32 may also vary. For example, the lateral width of the area 56 between the section 72 and the body region 32 may vary. The length of the channel region 54 may be adjusted. In some embodiments, the composite drift region 62 and the body region 32 need not be spaced from one another. Varying such characteristics may help increase the breakdown voltage, maintain a low drain-source resistance, and/or achieve an improved SOA.

The composite drift region 62 is further configured to achieve both a high breakdown voltage and low drain-source resistance (Rdson) levels by leveling the electrical field in certain locations within the composite drift region 62. In some locations, a leveled or constant electrical field may, in fact, correspond with an increase in the electrical field in certain areas relative to conventional RESURF designs.

The device 20 is shown in simplified form and, thus, FIG. 1 does not show the conductive (e.g., ohmic) contacts and other metal layers configured for electric coupling with the body contact region 34, the source region 36, the drain region 38, and the gate structure 40. The device 20 may have a number of other structures or components for connectivity, isolation, passivation, and other purposes not shown in FIG. 1 for ease in illustration. For instance, the device 20 may include any number of additional isolation regions or layers. In some examples, another p-type epitaxial layer (not shown) may be configured as a p-type barrier layer. One or more STI regions, isolation trenches, and/or isolation wells (not shown) may be provided to isolate the device area 30 and/or the body region 32.

Figure 2:
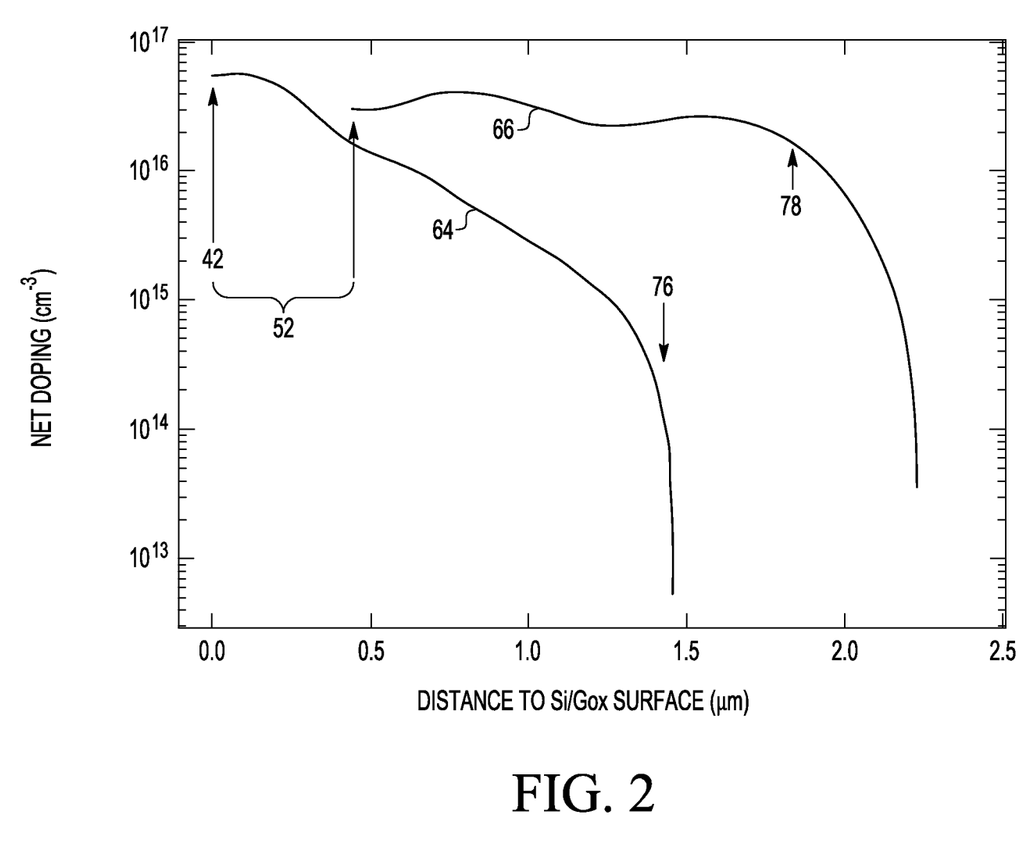
FIG. 2 is a graphical plot of dopant concentration levels as a function of depth in an exemplary composite drift region.

FIG. 2 depicts exemplary dopant concentration levels for an exemplary LDMOS device having a composite drift region formed from two dopant implantation procedures. In this example, the exterior section 64 of the composite drift region 62 (FIG. 1) has a dopant concentration profile that ranges from about $5 \times 10^{16}/cm^3$ at or near the surface 42 to about $1 \times 10^{15}/cm^3$ near the lower boundary 76. The interior section 66 begins below the STI region 52. The dopant concentration level of the interior section 66 is about $3 \times 10^{16}/cm^3$ until the lower boundary 78 is reached. In this example, the dopant concentration level in the interior section 66 is maintained through a greater depth or distance from the substrate surface 42, or gate oxide (Gox) surface. In this example, the concentration level is roughly constant through 2.0 microns. In contrast, the concentration level in the exterior section 64 begins to decrease at a depth of about 0.2 microns (shallower than the depth of the STI region 52).

As described above, the end portions or sections 72, 74 (FIG. 1) of the exterior section 64 may have a common dopant concentration profile in accordance with the profile shown in FIG. 2. The common dopant concentration profile may extend from a depth at which the end section 74 connects with the drain region 38 (FIG. 1) to a depth that corresponds with the lower boundary 76. As shown in FIG. 2, the common dopant concentration profile has a higher dopant concentration level than the interior section 66 at depths shallower than a lower boundary of the STI region 52, but a lower dopant concentration level than the interior section at depths deeper than the lower boundary of the STI region 52.

One or more of the sections of sections or constituent regions of the composite drift region 62 may have a non-uniform or varying dopant concentration profile. The dopant concentration level may vary as a function of depth. In one embodiment, the exterior section 64 has a non-uniform dopant concentration profile and the interior section 66 has a relatively uniform dopant concentration. The non-uniform dopant concentration profile of the exterior section 64 may be achieved in a variety of ways. In one example, the dopant concentration level varies gradually or continuously over the profile. For instance, the dopant concentration level may continuously decrease from a high level (e.g., $6 \times 10^{16}/cm^3$) at or near the surface 42 to a low level (e.g., $4 \times 10^{15}/cm^3$) at or near the lower boundary 76, differing by about one order of magnitude or more. The dopant concentration profile may have a delta-like shape. One example of a delta-like profile includes a tail that extends to a depth beyond mere surface-level doping, the tail extending without the sharp drop-off typically found in delta profiles. Alternatively, the dopant concentration level may vary in a more discontinuous or discrete manner over the profile. For example, the exterior section 64 may thus include discrete changes in dopant concentration level at one or more depths or lateral positions. In such cases, the exterior section 64 (or portions thereof) may thus include a number of sub-regions, each having a respective dopant concentration level. The dopant concentration level of the exterior section 64 may vary in any desired combination of continuous and discrete changes.

The non-uniformity of the dopant concentration level in the exterior section 64 allows the portion of the composite drift region 62 adjacent to the channel region 54 to have a different (e.g., higher) dopant concentration level than one or more portions spaced from the channel region 54. A higher dopant concentration level in the exterior section 64 where adjacent the channel region 54 may lead to a higher conductivity between the channel region 54 and the composite drift region 62. The drain-source resistance may thus stay low. A lower concentration level in the exterior section 64 where adjacent the interior sections 66, 68 increases the electric field in such portions of the composite drift region 62, thereby allowing the electric field to remain constant (or more constant) across the lateral extent of the composite drift region 62. The constant electric field may help avoid breakdown that would otherwise occur at a lower drain-source bias voltage at a point of maximum electric field.

In some embodiments, the lower concentration level in the exterior section 64 may be similar to (e.g., slightly higher than) the dopant concentration level of the epitaxial layer 24. The two levels may have a common order of magnitude (e.g., $10^{15}/cm^3$). The n-type concentration level of the exterior section 64 at this depth or position may slightly exceed and, thus, compensate for, the p-type concentration level of the epitaxial layer 24. The implantation procedure used to form the exterior section 64 may thus be considered a compensation implant to reflect the manner in which the doping compensates for the doping of the epitaxial layer 24, but not much more (e.g., without reaching moderate or heavy n-type dopant concentration levels). The compensation implant may be optimized or configured to form lightly doped regions of other devices, such as a base region of a bipolar transistor. Alternatively or additionally, the compensation implant is optimized or configured to reduce the threshold voltage of a transistor by compensating for the body doping.

The dopant concentrations, thicknesses, and other characteristics of the other above-described semiconductor regions in the semiconductor substrate 22 may vary. In one example, the above-referenced semiconductor regions may have the following approximate concentrations and thicknesses:

|  | Concentration | Thickness |
| --- | --- | --- |
| epitaxial 24: | $1 \times 10^{13}$-$3 \times 10^{15}$/cm$^3$ | 1-10 µm |
| substrate 26: | $1 \times 10^{15}$-$1 \times 10^{19}$/cm$^3$ | not applicable |
| body 32: | $1 \times 10^{16}$-$5 \times 10^{18}$/cm$^3$ | 0.5-2 µm |
| contact 34: | $1 \times 10^{20}$-$5 \times 10^{21}$/cm$^3$ | 0.15-0.25 µm |
| source 36: | $1 \times 10^{20}$-$5 \times 10^{21}$/cm$^3$ | 0.15-0.25 µm |
| drain 38: | $1 \times 10^{20}$-$5 \times 10^{21}$/cm$^3$ | 0.15-0.25 µm |
| STI 52: | not applicable | 0.35-0.5 µm |
| NLDD 60: | $1 \times 10^{18}$-$1 \times 10^{19}$/cm$^3$ | 0.2-0.3 µm |

The concentrations and thicknesses may be different in other embodiments. The concentration may vary considerably in some regions between embodiments, including, for instance, the original substrate 26.

Figure 3:
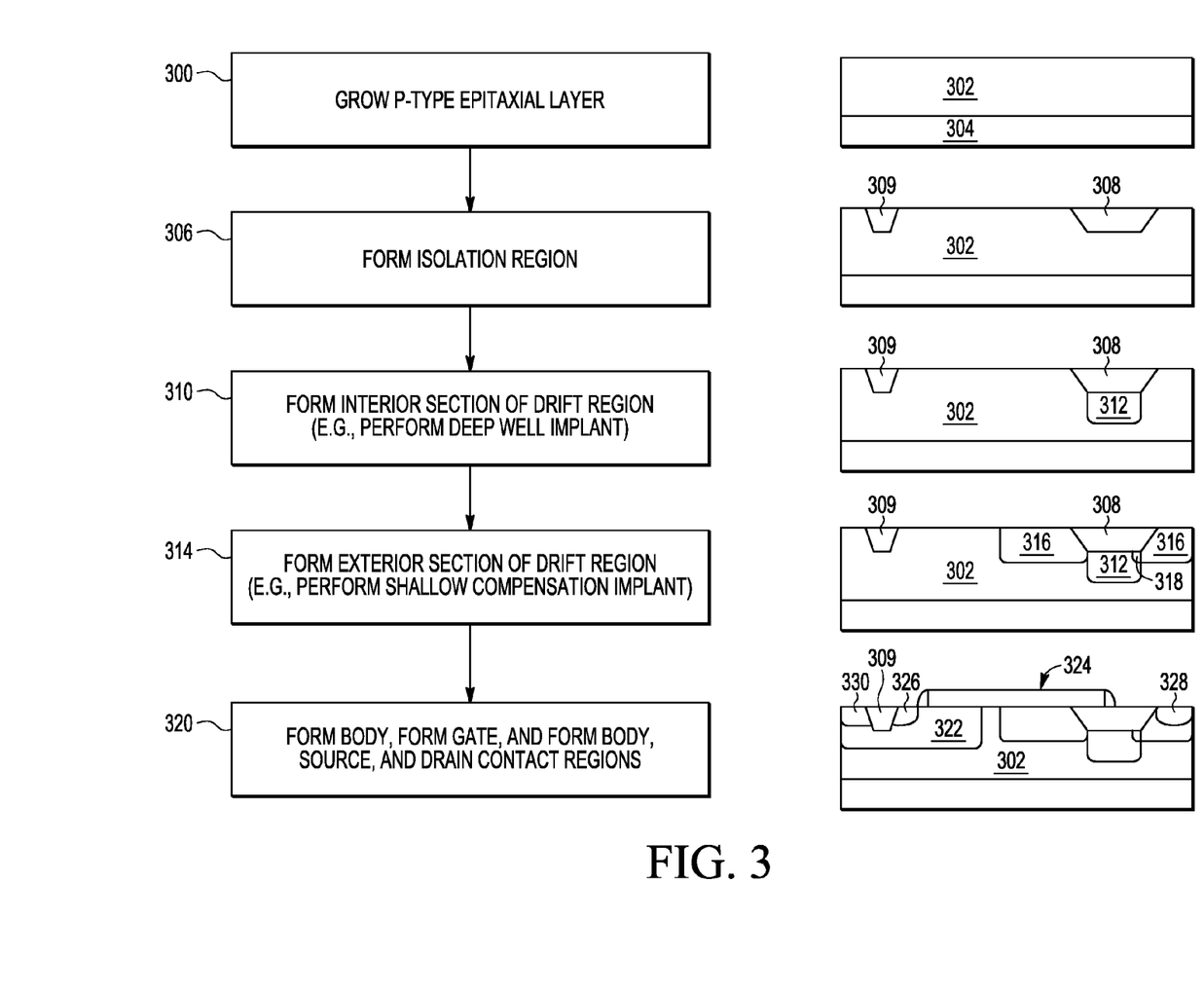
FIG. 3 is a flow diagram of an exemplary fabrication sequence to construct an re-channel LDMOS transistor device with a composite drift region in accordance with one embodiment.

FIG. 3 shows an exemplary fabrication method for fabricating a device with a composite drift region as described above. The method may be directed to fabricating a reduced surface field (RESURF) transistor having one or more of the features described above. The transistor is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, the order in which the acts 310 and 314 are performed to define the sections of the composite drift region may be reversed. Alternatively or additionally, a body region may be formed before the formation of one or more sections of the composite drift region. Thus, in some cases, the doping order is body region, shallow well drift section, and then deep well drift section. Other orders may be used. The fabrication method is not limited to any particular doping mechanism, and may include future developed doping techniques.

The method may begin with, or include, an act 300 in which a p-type epitaxial layer 302 is grown on a moderately or heavily doped p-type original semiconductor substrate 304. In some cases, the act 300 includes the formation via, e.g., ion implantation, of one or more buried isolation layers in the epitaxial layer. Any number of epitaxial layers may be grown. The original semiconductor substrate may be a bulk substrate or a semiconductor-on-insulator (SOI) substrate.

In act 306, STI regions 308 and 309 are formed in the epitaxial layer 302. The STI regions 308, 309 may be formed via any now known or hereafter developed procedure. For example, the act 306 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the formation (e.g., ion implantation) of one or more device regions. Any number of isolation regions may be formed in the act 306, including other STI regions and/or deep trench isolation (DTI) regions.

In act 310, an n-type well 312 is formed. In this example, the well 312 is disposed under the STI region 308 in the epitaxial layer 302. The well 312 defines or forms an interior section (or constituent region) of the composite drift region. The well 312 may be a deep well relative to other well regions of the device, such as other regions of the composite drift region, as well as the body region.

In some embodiments, the well 312 is formed via performance of a dopant implantation procedure. The dopant implantation procedure may be configured to establish a non-uniform dopant concentration profile as described above. The dopant implantation procedure may be configured to establish a dopant concentration at or near a bottom of the well 312 that overcomes the opposite dopant concentration of the epitaxial layer 24 in which the well 312 is formed.

In this embodiment, the dopant implantation procedure is configured such that the well 312 does not extend laterally beyond the STI region 308. Thus, in some cases, all of the dopant ions are implanted through the STI region 308. An implant through the STI region 308 may be useful to limit or control the depth of the well 312. In other embodiments, the well 312 is formed before the STI region 308 and/or the dopant ions are not implanted through the STI region 308.

The dopant implantation procedure performed to form the well 312 may be an existing implant. The existing implant may be configured to form respective regions of a further transistor formed in the semiconductor substrate. In some cases, the further transistor is configured for operation at a lower voltage tier than the first-named transistor, such as a lower tier power transistor. For example, the implant may be configured to form a drift region (e.g., the entire drift region) of a lower voltage tier transistor. Alternatively or additionally, the implant may be configured to form a region of a bipolar transistor device. The use of an existing implant allows the device to be fabricated without requiring an implant dedicated to forming a section of the composite drift region.

In act 314, another n-type well 316 is formed. The well 316 is adjacent to the well region 312. The well 316 defines or forms an exterior section of the composite drift region. The well 316, and thus, the exterior section, is disposed on opposite sides of the well 312 and, thus, the interior section. The exterior section may include a pair of end portions as described above. The well 316 may be disposed adjacent the STI region 308 in the epitaxial layer 302 as shown.

The well 316 may be a shallow well relative to other well regions of the device, such as other regions of the composite drift region (e.g., the well 312), as well as the body region. The well 316 may also be considered a shallow well due to the dopant concentration profile of the well 316. For example, the well 316 may have a dopant concentration profile similar to the embodiment of FIG. 2, in which the dopant concentration level drops off sharply from a maximum concentration level at a shallow depth (e.g., before the well 312 begins at the bottom of the STI region 308) as shown.

The well 316 may be formed via performance of an additional dopant implantation procedure. In the embodiment of FIG. 3, the dopant implantation procedure may be configured (e.g., via photolithography) such that the well 316 has two end or outer portions spaced apart from one another by a hole. The well 312 is disposed in the hole as described above and shown in FIG. 3. The same dopant implantation procedure may thus be used to define both end portions of the exterior section of the composite drift region. The end portions may accordingly have a common dopant concentration profile. Additional and/or alternative implantation procedures may be used. For example, multiple implantation procedures may be used to form outer or end portions or sections of the composite drift region. The dopant concentration profiles of the outer portions may thus differ from one another in such cases.

The dopant implantation procedure used to form the well 316 may be an existing implant. The existing implant may be configured to form or modify respective regions of a further transistor formed in the semiconductor substrate. For example, the existing implant may be used to form a base region of a bipolar transistor. The implant may compensate for the doping level of the epitaxial layer 302 by doping at a slightly higher level. In the former case, the compensation implant is configured to switch the conductivity type of the region being formed (e.g., the base region), but while remaining a lightly doped region. The base region of the bipolar transistor may thus, in some cases, have a dopant concentration level on the same order of magnitude as the dopant concentration level of the epitaxial layer. For the present LDMOS device, the compensation implant may be configured such that the exterior section 316 has an effective dopant concentration level on the same order of magnitude as the dopant concentration level of the epitaxial layer. The existing implant may be used or configured as a compensation implant in alternative or additional ways. For example, the implant may compensate for the doping level of a device body to adjust a threshold voltage of the transistor device. In such cases, the compensation implant is configured to reduce the effective dopant concentration level without switching the conductivity type.

The dopant implantation procedures of the acts 310, 314 may be configured to implant dopant in respective areas that overlap to define a further interior section of the composite drift region. The overlap results in a higher dopant concentration level than present in the well 312 (or the corresponding interior section) or the well 316 (or the corresponding exterior section) alone. In the embodiment of FIG. 3, the well 316 overlaps the well 312 to define an interior section 318 of the composite drift region. In this example, the interior section 318 is disposed under the STI region 308. In other embodiments, the wells 312, 316 may not overlap (e.g., the implants are configured line-on-line on both sides of the well 312), or include further or alternative overlapping portions.

The wells 312, 316 may be configured such that the exterior section has a lower effective dopant concentration level than the interior section, as described above. The dopant implantation procedures used to form the wells 312, 316 may be configured to establish the different dopant concentration levels. Additional or alternative implantation procedures may be performed in the act 310 and/or the act 314 to achieve a desired dopant concentration level. The dopant implantation procedures may be configured to establish a shallower lower boundary for the exterior section relative to the interior section.

In an alternative embodiment, the order of the acts 310, 314 is reversed. Thus, the order of the dopant implantation procedures used to form the composite drift region may vary. For example, the exterior section may be formed before the interior section.

The fabrication process may then include one or more procedures collectively shown in act 320. Some of the procedures may be implemented in various orders. Additional or alternative procedures may be implemented. In one example, a p-type well 322 is formed to define the device body. An ion implantation procedure may be used. A gate structure 324 may then be formed through the growth or other deposition of a gate dielectric layer, conductive layer, and sidewalls spacers. Source and drain regions 326, 328 may then be formed, using the gate structure for self-alignment, and via one or more n-type ion implantation procedures. For example, formation of one or both of the source region 326 and the drain region 328 may include a moderate implant before formation of sidewall spacers of the gate structure 324 to create one or more extension or transition regions (see, e.g., FIG. 1). A heavy implant after formation of the sidewall spacers may then be implemented to form the source and/or drain regions 326, 328 adjacent to such transition regions. A heavily doped p-type contact region 330 for the device body may be formed in the p-type well 322 via a separate ion implantation procedure. The contact region 330 is spaced from the source region 326 by the STI region 309.

Additional acts may be implemented at various points during the fabrication procedure. For example, one or more acts may be directed to defining an active area of the device. In some cases, such acts may include the formation of a doped device isolation well and/or one or more isolation regions, such as DTI regions. One or more metal layers may be deposited to provide connectivity to the device.

The embodiments described above include devices and methods of fabricating devices having a composite, adaptive and/or engineered drift region. A number of device operational parameters may be improved, including output impedance, breakdown voltage level, and SOA. Such improvements may be achieved without increasing process costs and while maintaining a low drain-source on-resistance (Rdson). The engineering of the drift region provides an effectively lightly doped drift region to suppress impact ionization and, thus, reduce body current. The composite drift region may be formed via two existing implant layers, which may be optimized for other devices. One layer may be a shallow layer (e.g., a compensation implant), while the other may be a deep well layer. A hole is provided in the shallow layer, the ends of which are connected by the deep well layer. Various non-overlapping and overlapping arrangements of these layers may provide an adaptive drift region with multiple sections of different doping levels (e.g., three or four sections or constituent regions). The adaptive drift region allows the device to exhibit an improved output impedance, a higher breakdown voltage, and an improved SOA. These improvements may be achieved without additional process cost or complexity as a result of the use of existing implant layers. The improvements in output impedance and SOA may be useful in a variety of analog applications, such as current mirrors and amplifiers.

In a first aspect, a device includes a semiconductor substrate, a body region in the semiconductor substrate having a first conductivity type and in which a channel is formed during operation, source and drain regions in the semiconductor substrate and having a second conductivity type, the source region being disposed on the body region, and a composite drift region in the semiconductor substrate, having the second conductivity type, and through which charge carriers from the source region drift to reach the drain region after passing through the channel. The composite drift region includes a first section adjacent the channel, a second section adjacent the drain region, and a third section disposed between the first and second sections. The first and second sections have a lower effective dopant concentration level than the third section.

In a second aspect, an electronic apparatus includes a semiconductor substrate and a transistor disposed in the semiconductor substrate. The transistor includes a well region having a first conductivity type and in which a conduction path is formed during operation, first and second contact regions having a second conductivity type, the first contact region being disposed within the well region, and a composite region having the second conductivity type. Charge carriers from the first contact region pass through the composite region to reach the second contact region after passing through the conduction path. The composite region includes an interior section and an exterior section disposed on opposite sides of the interior section. The exterior section has a lower effective dopant concentration level than the interior section.

In a third aspect, a method of fabricating a transistor includes forming an exterior section of a composite drift region of the transistor in a semiconductor substrate and forming an interior section of the composite drift region. The exterior section is disposed on opposite sides of the interior section. The exterior section has a lower effective dopant concentration level than the interior section.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate having a surface;
a gate structure supported by the semiconductor substrate at the surface;
a body region in the semiconductor substrate having a first conductivity type and in which a channel is formed proximate the gate structure;
source and drain regions in the semiconductor substrate and having a second conductivity type, the source region being disposed on the body region;
an isolation region disposed in the semiconductor substrate between the body region and the drain region; and
a composite drift region in the semiconductor substrate, having the second conductivity type, and through which charge carriers from the source region drift to reach the drain region after passing through the channel;
wherein the composite drift region comprises a first, channel-side section adjacent the channel, a second, drain-side section adjacent the drain region, and a third section disposed between the first and second sections;
wherein the first and second sections have a dopant concentration level that decreases by an order of magnitude or more between upper and lower boundaries of the first and second sections;
wherein the first and second sections have a lower dopant concentration level than the third section at a first depth, relative to the surface of the semiconductor substrate, deeper than a lower boundary of the isolation region; and
wherein the first and second sections have a higher dopant concentration level than the third section at a second depth, relative to the surface of the semiconductor substrate, shallower than the lower boundary of the isolation region.

2. The device of claim 1, wherein the first and second sections have a shallower lower boundary relative to the surface of the semiconductor substrate than the third section.

3. The device of claim 1, wherein:
the first and second sections form an outer portion of the composite drift region;
the outer portion has a hole; and
the third section is disposed in the hole.

4. The device of claim 1, wherein:
the composite drift region comprises a fourth section disposed between the second and third sections; and
the fourth section has a higher dopant concentration level than the first, second, and third sections.

5. The device of claim 1, wherein the third section of the composite drift region is disposed under the isolation region.

6. The device of claim 5, wherein the third section of the composite drift region does not laterally extend beyond the isolation region.

7. The device of claim 1, wherein the first and third sections are contiguous with one another.

8. The device of claim 1, wherein the first and second sections have a common dopant concentration profile from a first depth at which the second section connects with the drain region to a second depth that corresponds with a lower boundary of the first and second sections.

9. An electronic apparatus comprising:
a semiconductor substrate having a surface; and
a transistor disposed in the semiconductor substrate, the transistor comprising:
a gate structure supported by the semiconductor substrate at the surface;
a well region having a first conductivity type and in which a channel is formed proximate the gate structure;
first and second contact regions having a second conductivity type, the first contact region being disposed within the well region;
an isolation region disposed in the semiconductor substrate between the well region and the second contact region; and
a composite region having the second conductivity type, wherein charge carriers from the first contact region pass through the composite region to reach the second contact region after passing through the channel;
wherein the composite region comprises an interior section, a first exterior, channel-side section, and a second exterior, contact-side section adjacent the second contact region;
wherein the interior section is disposed between the first and second exterior sections;
wherein the first and second exterior sections have a dopant concentration level that decreases by an order of magnitude or more between upper and lower boundaries of the first and second exterior sections;

wherein the first and second exterior sections have a lower dopant concentration level than the interior section at a first depth, relative to the surface of the semiconductor substrate, deeper than a lower boundary of the isolation region; and wherein the first and second exterior sections have a higher dopant concentration level than the interior section at a second depth, relative to the surface of the semiconductor substrate, shallower than the lower boundary of the isolation region.

10. The electronic apparatus of claim 9, wherein the first and second exterior sections have a shallower lower boundary relative to the surface of the semiconductor substrate than the interior section.

11. The electronic apparatus of claim 9, wherein:
the composite region comprises a further interior section disposed along a side of the second exterior section on the side proximate the second contact region; and
the further interior section has a higher dopant concentration level than the interior section and the first and second exterior sections.

12. The electronic apparatus of claim 11, wherein the interior section and the further interior section are disposed under the isolation region.

13. The electronic apparatus of claim 12, wherein the interior section and the further interior section do not laterally extend beyond the isolation region.

14. The device of claim 1, wherein the semiconductor substrate comprises an epitaxial layer in which the composite drift region is disposed, the epitaxial layer having the first conductivity type, and wherein dopant concentration levels of the epitaxial layer and the first and second sections at the first depth have a common order of magnitude.

15. The electronic apparatus of claim 9, wherein the semiconductor substrate comprises an epitaxial layer in which the composite region is disposed, the epitaxial layer having the first conductivity type, and wherein dopant concentration levels of the epitaxial layer and the first and second exterior sections at the first depth have a common order of magnitude.

16. The electronic apparatus of claim 9, wherein the first and second exterior sections have a common dopant concentration profile.

17. The device of claim 1, wherein:
the first section defines an accumulation region configured to accumulate charge carriers after the charge carriers pass through the channel; and
the second section is in contact with the drain region.

18. The electronic apparatus of claim 9, wherein
the first exterior section defines an accumulation region configured to accumulate charge carriers after the charge carriers pass through the channel; and
the second exterior section is in contact with the second contact region.

* * * * *